United States Patent
Mohammad et al.

(10) Patent No.: US 9,792,977 B2
(45) Date of Patent: Oct. 17, 2017

(54) VOLATILE MEMORY ERASURE BY MANIPULATING REFERENCE VOLTAGE OF THE MEMORY

(71) Applicant: Khalifa University of Science, Technology & Research (KUSTAR), Abu Dhabi (AE)

(72) Inventors: Baker Shehadah Mohammad, Abu Dhabi (AE); Khaled Hamed Salah, Abu Dhabi (AE); Mahmoud Abdullah Al-Qutayri, Abu Dhabi (AE)

(73) Assignee: Khalifa University of Science and Technology (AE)

( * ) Notice: Subject to any disclaimer, the term of this patent is extended or adjusted under 35 U.S.C. 154(b) by 0 days.

(21) Appl. No.: 14/679,162

(22) Filed: Apr. 6, 2015

(65) Prior Publication Data

US 2016/0293244 A1    Oct. 6, 2016

(51) Int. Cl.

| G06F 1/26 | (2006.01) |
|---|---|
| G11C 11/409 | (2006.01) |
| G06F 1/32 | (2006.01) |
| G11C 11/4072 | (2006.01) |

(52) U.S. Cl.
CPC .......... *G11C 11/409* (2013.01); *G06F 1/3275* (2013.01); *G06F 1/3287* (2013.01); *G11C 11/4072* (2013.01)

(58) Field of Classification Search
None
See application file for complete search history.

(56) References Cited

U.S. PATENT DOCUMENTS

| 7,911,826 B1* | 3/2011 | Liu | G11O 5/14 326/37 |
|---|---|---|---|
| 9,323,552 B1* | 4/2016 | Adogla | G06F 9/45558 |
| 2012/0254864 A1* | 10/2012 | Bork | G06F 9/45558 718/1 |
| 2013/0290760 A1* | 10/2013 | Cooper | G06F 1/32 713/323 |

* cited by examiner

*Primary Examiner* — Paul Yanchus, III
(74) *Attorney, Agent, or Firm* — Hayes Soloway PC

(57) ABSTRACT

The present invention provides an erasure circuitry, a method for erasing a volatile memory, a volatile memory and erasure module in the form of computer readable instructions, where the erasure circuitry is adapted to erase the memory at occurrence of a predefined event. The erasure circuitry includes a negative pulse generator which is adapted to reduce the charge on capacitor in one or more volatile memory cells to zero logic by using a switch connected to the Voltage Reference (Vref) of the volatile memory cell, a controller and a negative power supply. The switch and the negative power supply impose a negative pulse on the Vref of the volatile memory cells on being instructed by the controller at the occurrence of a predefined event. An erasure module associated with the controller is provided for instructing the erasure circuitry for erasing data at the occurrence of a predefined event.

32 Claims, 15 Drawing Sheets

VOLATILE MEMORY ERASURE BY MANIPULATING REFERENCE VOLTAGE OF THE MEMORY

FIELD OF THE INVENTION

The present invention relates generally to volatile memory erasure and more particularly to a method, an erasure circuitry, and a volatile memory adapted for erasing the data stored inside one or more memory banks of the memory.

BACKGROUND OF THE INVENTION

In the cloud virtualized infrastructure, multiple tenants may co-exist in the same physical host, sharing the host's physical DRAM memory and disk storage. Virtualization technology used in the cloud creates the illusion of having multiple virtual machines (VMs) within the same physical host by means of sharing and multiplexing the host resources which include its multiple CPU cores, physical memory, and hard disk. FIG. 1 shows three VMs which belong to different users that are allocated portions of physical memory and hard disk.

In the cloud, the VMs are allocated on demand and dynamically to different users. A VM may stay running for some period of time (minutes, hours, or days) and then get terminated by a user. Once terminated, its resources are re-allocated to a newly provisioned VM. Each time a new VM is allocated, its resources are allocated from the older VM resources, as shown in FIG. 2.

FIG. 2 illustrates resource allocation after termination of VM2 and provisioning of VM4. FIG. 2(a) shows that the memory and disk resources of VM2 are available for use after VM2 termination. In FIG. 2(b), a new virtual machine is provisioned by user 4 (VM4) and has been allocated the memory and disk resources of VM2. Once VM4 is running, the user of this VM can have access to the content of DRAM and disk storage which was used by the older user. The new user can simply take memory images and snapshots and then perform offline forensic analysis to extract sensitive information of the older user. This indeed poses a serious data privacy problem.

As has been illustrated, a critical security problem and data privacy issue can exist if the DRAM content is not sanitized or wiped out before being allocated to a newly provisioned VM. The cloud provider has to provide a total isolation and protection of user data during run time and after termination. If the data in physical memory and hard disk are not properly sanitized and deleted at run time and after deletion, sensitive information can be leaked, thereby jeopardizing the privacy of the cloud users and their data. Sensitive information may include confidential documents and images, passwords, encryption keys, personal information and records, banking and credit card information, metadata, etc.

The cloud computing platform is just one example of contexts where physical memory is shared between multiple users. A single physical machine can also provide access to multiple users in a sequential manner such that different sessions are initiated and terminated for different users. If data stored on the physical memory by one user is not deleted, this data can be accessed by a subsequent user accessing the machine.

To date, wiping out the DRAM and disk storage, if done, is performed using software by means of zeroing out DRAM content using software. At boot time of the newly provisioned VM, the software would write zeroes or random data to the DRAM. The zeroing out method involves the CPU to carry out sequential memory-write operations of zeros to all physical memory locations. This is considerably slow and expensive operation especially. For a small size, it may take a few seconds to wipe out 1 GB DRAM. For larger-size VMs, the DRAM portion can be as big as 64 GB or more. For this, wiping out the memory using software may take a few minutes. Such time is not acceptable in some contexts such as by the cloud user as it prolongs the launch and boot time of VM instances.

Other methods can zero out the memory using software at user session/VM termination (and not at boot time). Still, this solution is not adequate and will slow down enormously the availability of the freed memory to be allocated to newly provisioned users/VMs.

In short, software solutions that deal with zeroing out the physical memory at boot up or after termination are not adequate solutions, due to the computation overhead cost. That is, such software solutions will be considerably slow considering the size of the allocated RAM which can be in tens of gigabytes. Such solutions may take minutes, and will stretch the bootup time enormously. Equally, it is also imperative to shorten the termination time of a machine (such as a VM) so that freed resources can be allocated quickly to newly provisioned VMs.

Further, it will be understood to the persons skilled in the art that DRAM provides maximum memory density at cost of access time. Basic DRAM cell 3 consists of one nMOS transistor and one capacitor (FIG. 3). The transistor is used to control access to the storage element (capacitor). The memory state is stored as charge on the capacitor. Since the charge on the capacitor can leak away hence, the need for refreshing when DRAM is used. The refreshing time is determined by the time the capacitor can maintain enough charge to indicate logic one. In addition to refreshing DRAM read access is destructive which means when the cell gets access for read the data stored is disturbed and another operation need to be performed to re-store data.

Memory controller keeps track of memory array access and refreshing times. It is proposed to utilize this hardware feature that already exists to zeroing DRAM content. This provides hardware managed solution which is much faster than the software counterpart. The implementation of the proposed scheme can vary based on the tradeoff between memory availability, area overhead, and design complexity.

The array size can be static for all programs and will depend on the total memory size or it can be dynamic based on number of programs and overall system performance. FIG. 4 depicts a typical memory array organization with a major interface where N+M are address bits and D is the data interface. FIG. 5 depicts a typical memory organization with multiple banks. A typical VM system requires RAM sizes ranges from 1 GB to 16 GB and each array size is ranged from 256 KB to 1 MB.

SUMMARY OF THE INVENTION

The present invention aims to overcome the above mentioned limitations and other problems associated with the prior art.

The present invention provides an erasure circuitry, a method for erasing a volatile memory, a volatile memory and erasure module in the form of computer readable instructions, where the erasure circuitry is adapted to erase the memory at occurrence of a predefined event. The erasure circuitry includes a negative pulse generator which is adapted to reduce the charge on capacitor in one or more volatile memory cells to zero logic by using a switch connected to the Voltage Reference (Vref) of the volatile memory cell, a controller and a negative power supply. The switch and the negative power supply impose a negative pulse on the Vref of the volatile memory cells on being instructed by the controller at the occurrence of a predefined event.

In an embodiment of the present invention, the erasure circuitry further includes a controller associated with the negative pulse generator and an erasure module which is associated with the controller such that the controller is adapted to activate the negative pulse generator on being instructed by the erasure module.

In an embodiment of the present invention, the erasure module instructs the activation of the negative pulse generator on the occurrence of the predefined event.

In an embodiment of the present invention, the volatile memory is connected to a processing unit which is accessible by multiple users, processes, applications or services such that the predefined event is before switching between first user, process, application or service and a subsequent user, process, application or service such that any data stored inside the memory by the first user is erased by the imposition of negative pulse on the Vref by activating the negative pulse generator.

In an embodiment of the present invention, the processing unit is part of a virtual machine in a cloud computing platform.

In an embodiment of the present invention, the processing unit is part of an electronic device or a server.

In an embodiment of the present invention, the volatile memory is dynamically allocated to multiple processing units and the predefined event occurs before reallocation of the memory from a first processing unit to a second processing unit such that any data stored inside the memory using the first processing unit gets erased by the effect of imposition of negative pulse on the Vref by activating the negative pulse generator.

In an embodiment of the present invention, the processing units are part of one or more virtual machines in a cloud computing platform.

In an embodiment of the present invention, the volatile memory for erasure is one or more memory banks of a dynamic random access memory (DRAM).

In an embodiment of the present invention, the controller is a DRAM controller.

In another aspect, the present invention provides a volatile memory which includes a negative pulse generator adapted to generate a negative pulse for reducing Vref of one or more of the volatile memory cells to zero logic at occurrence of a predefined event.

In yet another aspect, the present invention provides a method for erasing a volatile memory having a plurality of memory cells. The method involves the imposing of a negative pulse on Vref of one or more of the memory cells to reduce the Vref of the one or more memory cells to zero logic at the occurrence of a predefined event.

BRIEF DESCRIPTION OF THE DRAWINGS

The advantages and features of the present disclosure will become better understood with reference to the following detailed description and claims taken in conjunction with the accompanying drawing, in which:

Like numerals refer to like elements throughout the present disclosure.

DETAILED DESCRIPTION OF THE INVENTION

The exemplary embodiments described herein for illustrative purposes are subject to many variations in structure and design. It should be emphasized, however, that the present invention is not limited to method for erasing data from a volatile memory. It is understood that various omissions and substitutions of equivalents are contemplated as circumstances may suggest or render expedient, but these are intended to cover the application or implementation without departing from the spirit or scope of the present invention.

The terms "a" and "an" herein do not denote a limitation of quantity, but rather denote the presence of at least one of the referenced item.

The terms "having", "comprising", "including", and variations thereof signify the presence of a component.

The present invention provides a software-hardware based technique to erase the data stored on volatile memory. It will be understood for the persons skilled in the art that the volatile memory needs to be refreshed regularly in order to preserve data from leakage. Therefore, the volatile memory may be having a refresh circuitry to ensure that purpose.

Figure 11:
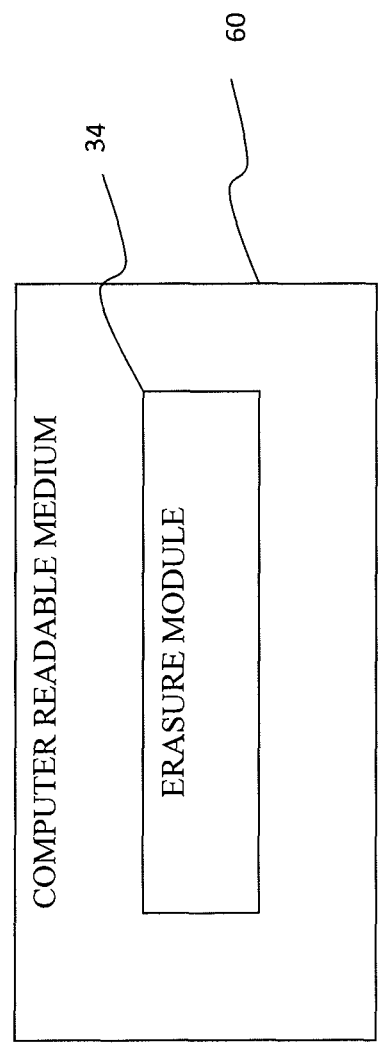
FIG. 11 illustrates a computer readable medium comprising an erasure module in accordance with an embodiment of the invention.
Figure 12A:
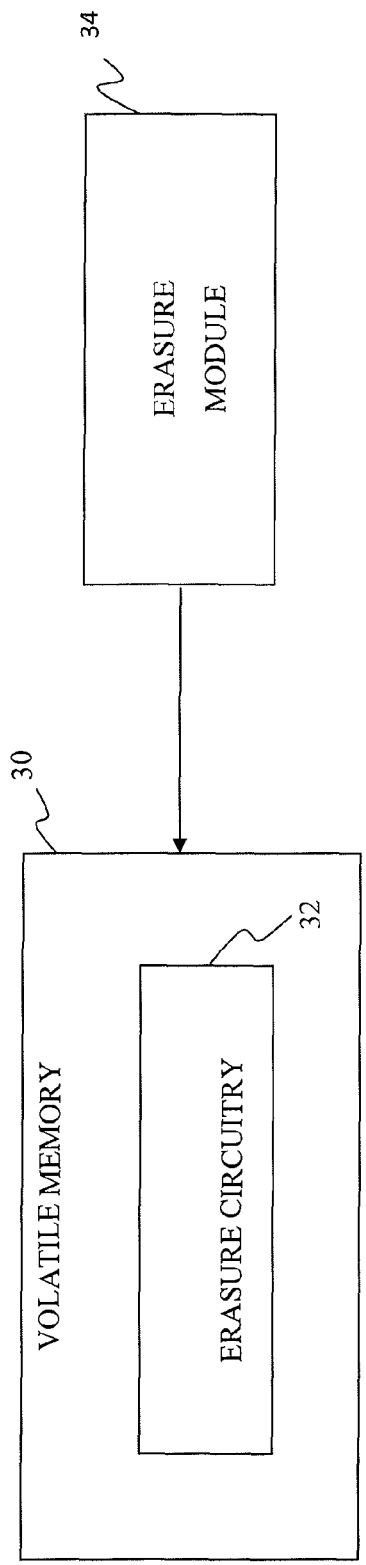
FIG. 12(a) is a block diagram illustrating a volatile memory comprising an erasure circuitry in accordance with an embodiment of the invention.
Figure 12B:
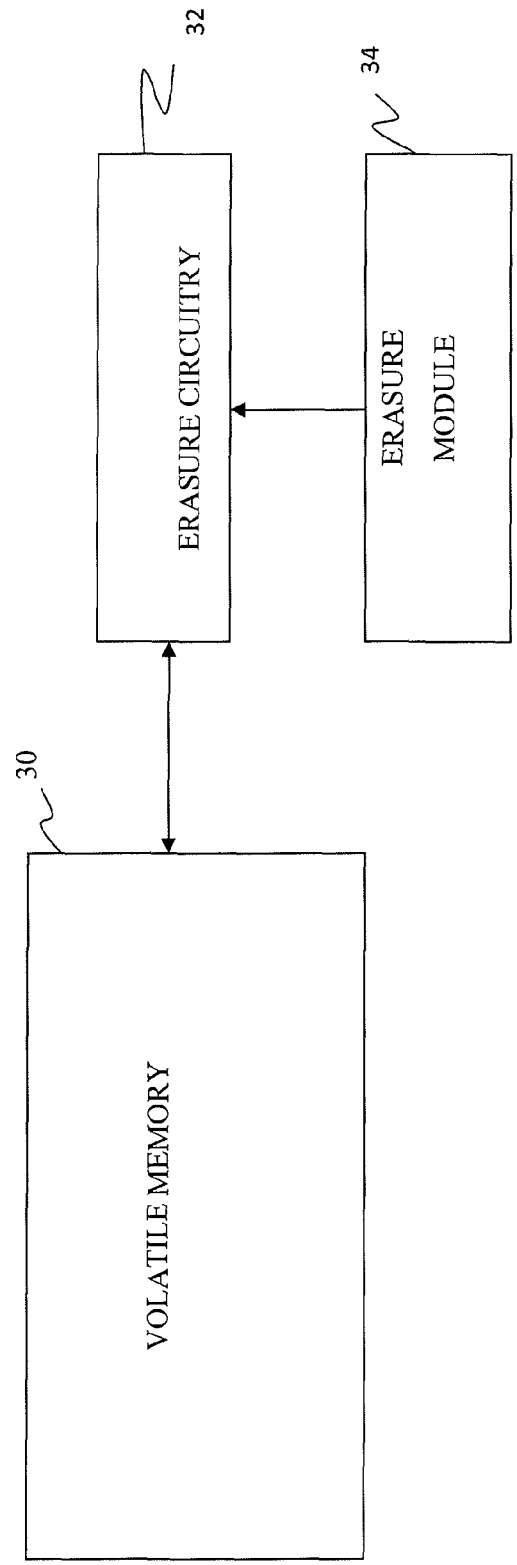
FIG. 12(b) is a block diagram illustrating a volatile memory comprising an erasure circuitry in accordance with another embodiment of the invention.

The present invention proposes a method (see FIGS. 6-7), an erasure circuitry 32 adapted to erase the memory by imposing a negative pulse on the Voltage Reference (Vref) (see FIG. 3*b*), and a computer encoded medium which includes an erasure module 34 (see FIG. 11). There is also proposed a volatile memory including the erasure circuitry (FIG. 12*a* and FIG. 12*b*).

Figure 1:
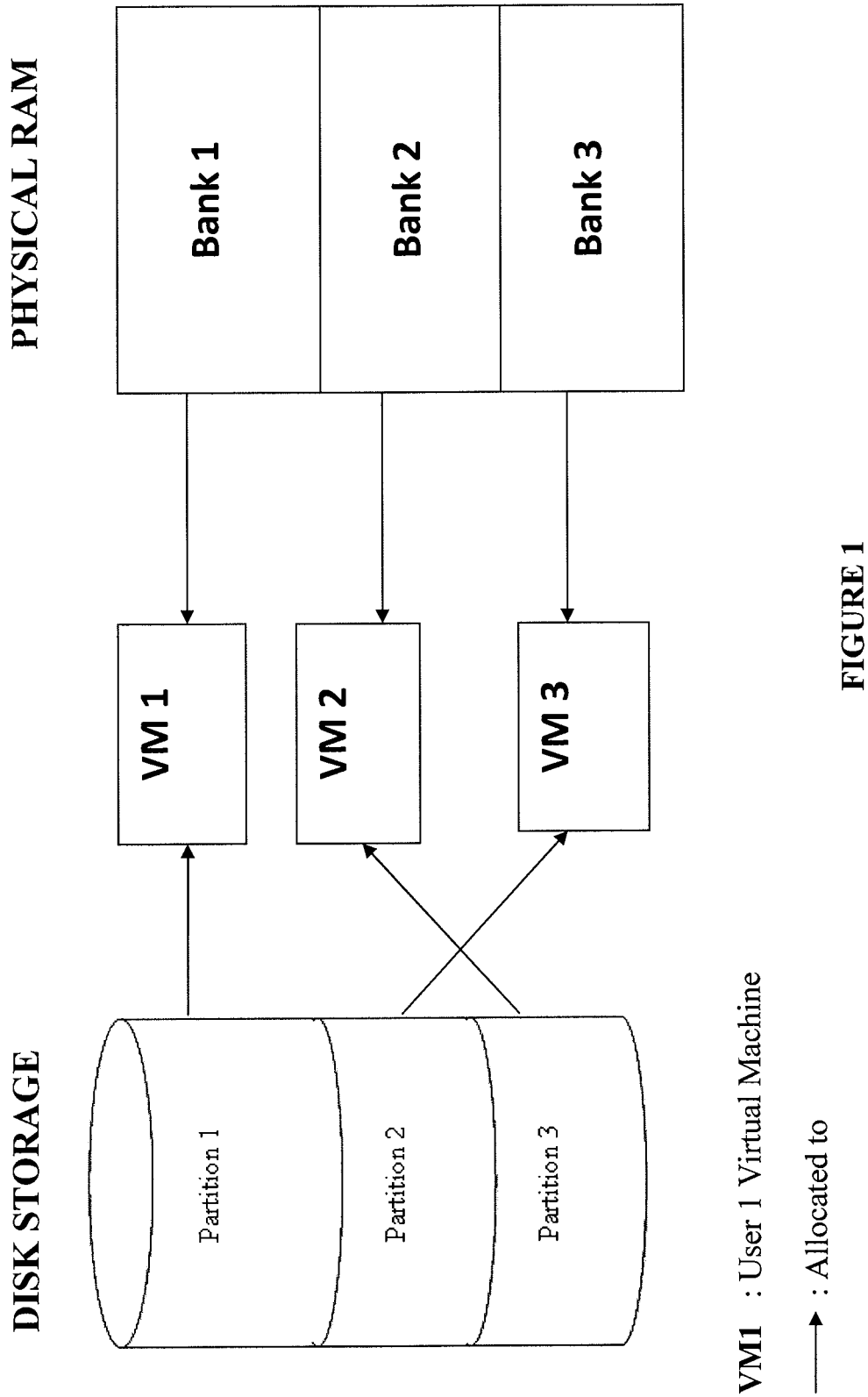
FIG. 1 illustrates a typical virtual machines resource allocation for multiple users in the cloud within a single physical machine.
Figure 2:
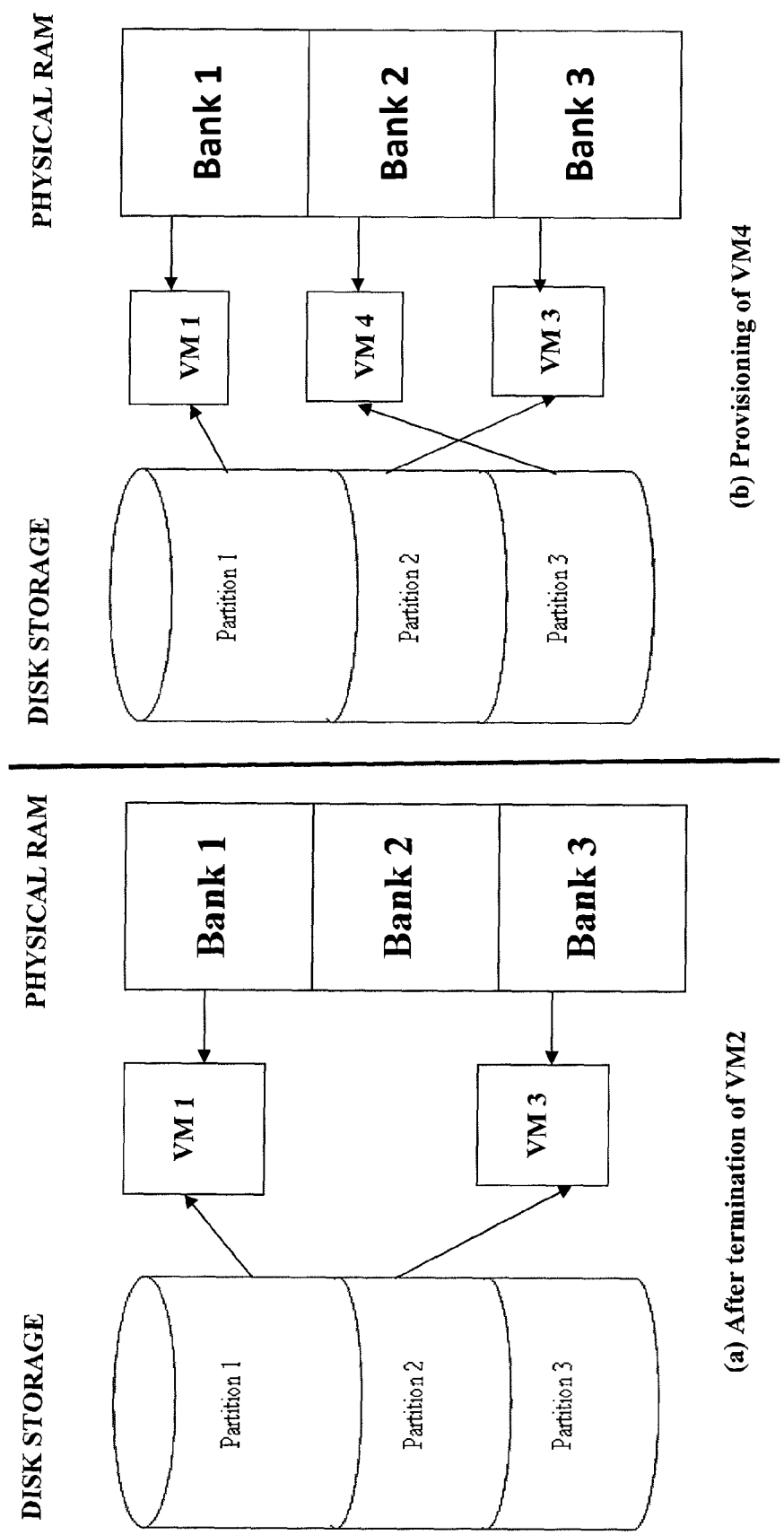
FIG. 2 illustrates resource allocation after termination of VM2 and provisioning of VM4.
Figure 3A:
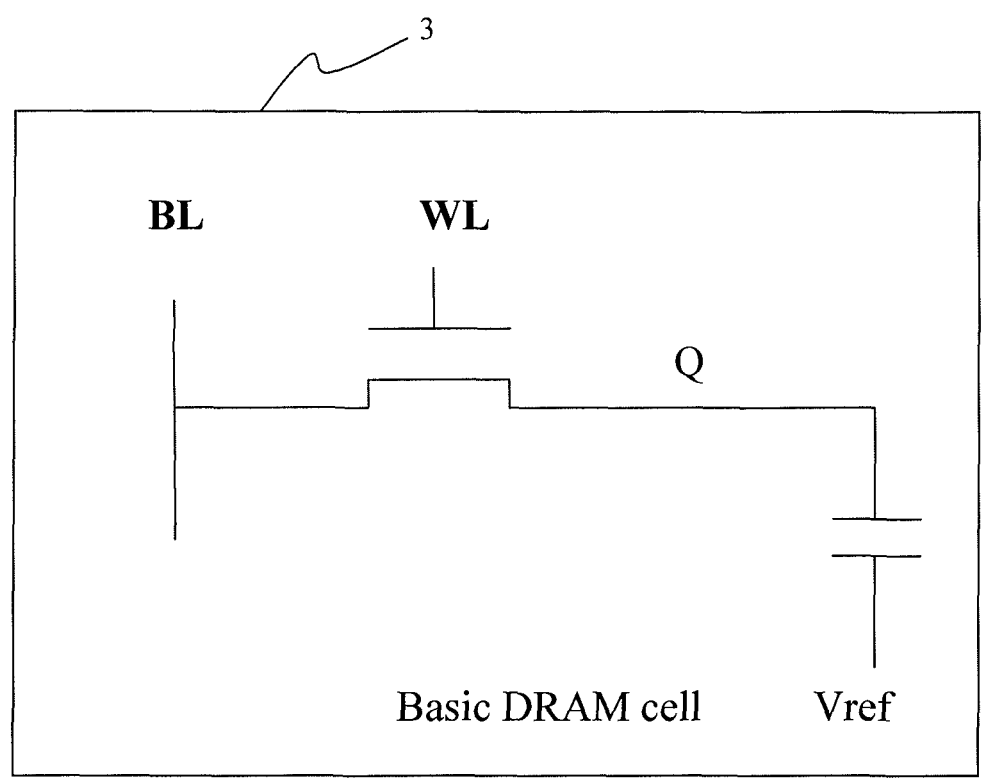
FIG. 3(a) illustrates a DRAM cell structure.
Figure 3B:
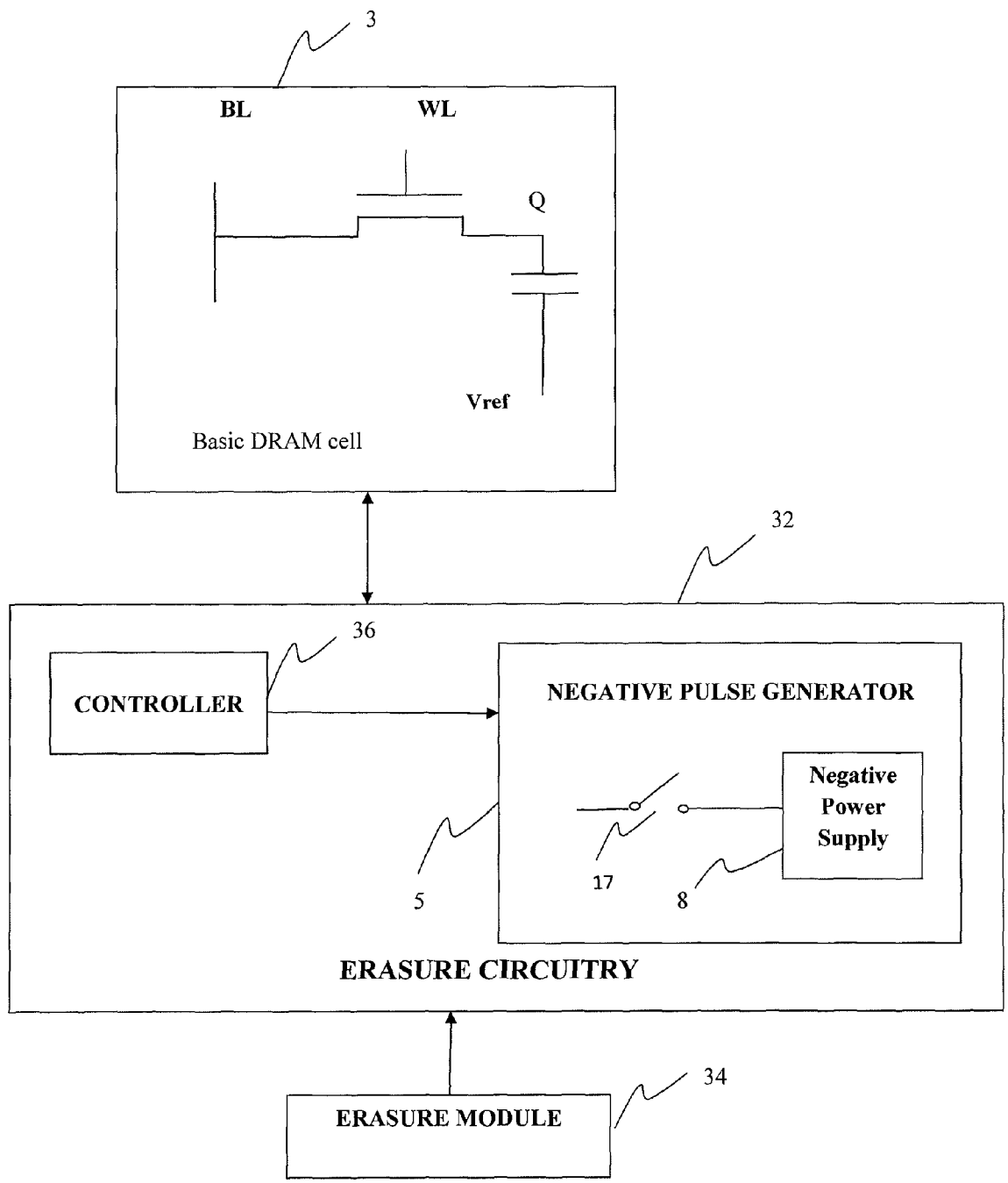
FIG. 3(b) is a block diagram illustrating the functional relation between the volatile memory cell, erasure circuitry, erasure module and controller.
Figure 4:
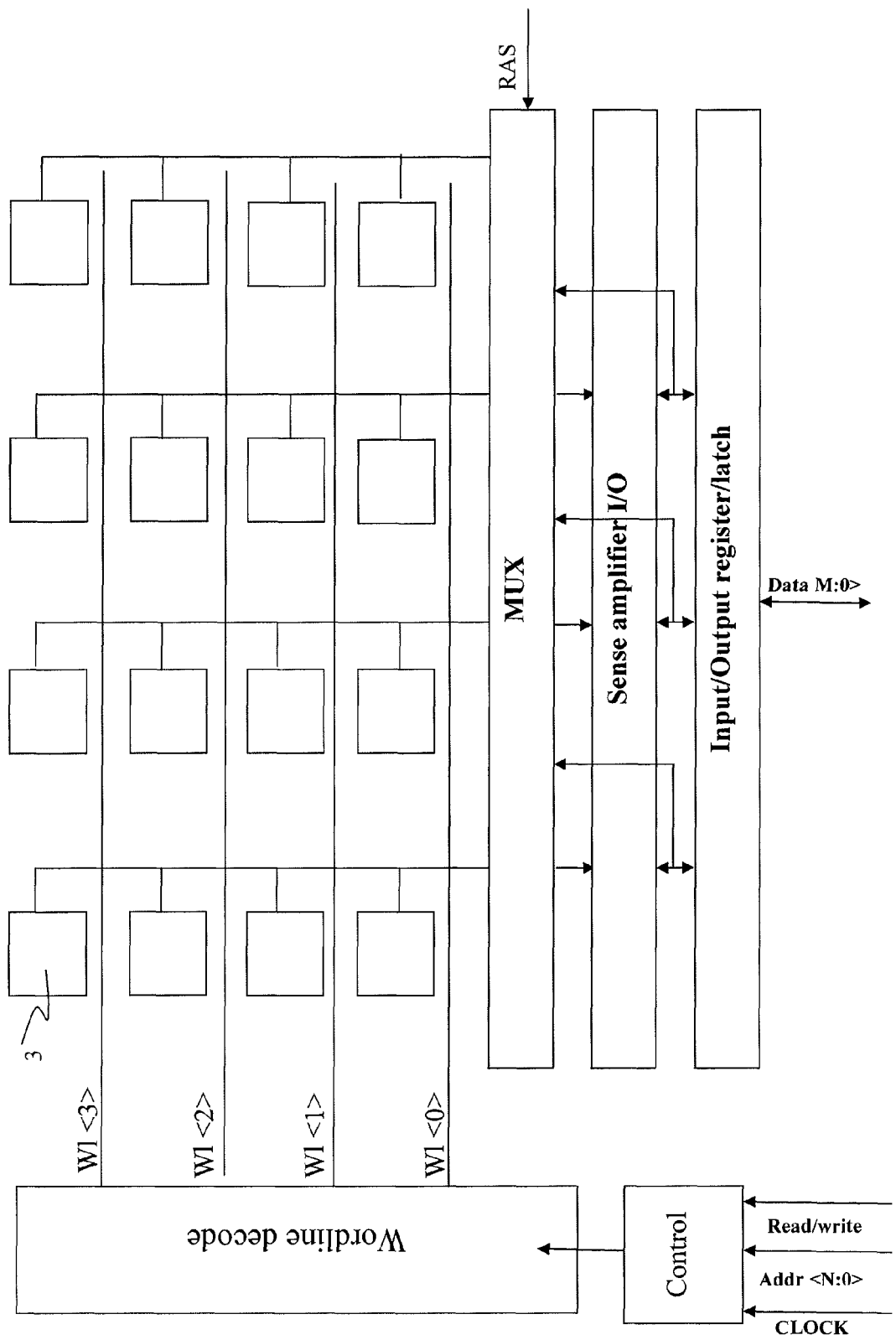
FIG. 4 illustrates a typical memory array organization where major interface N+M are address bits and D is the data interface.
Figure 5:
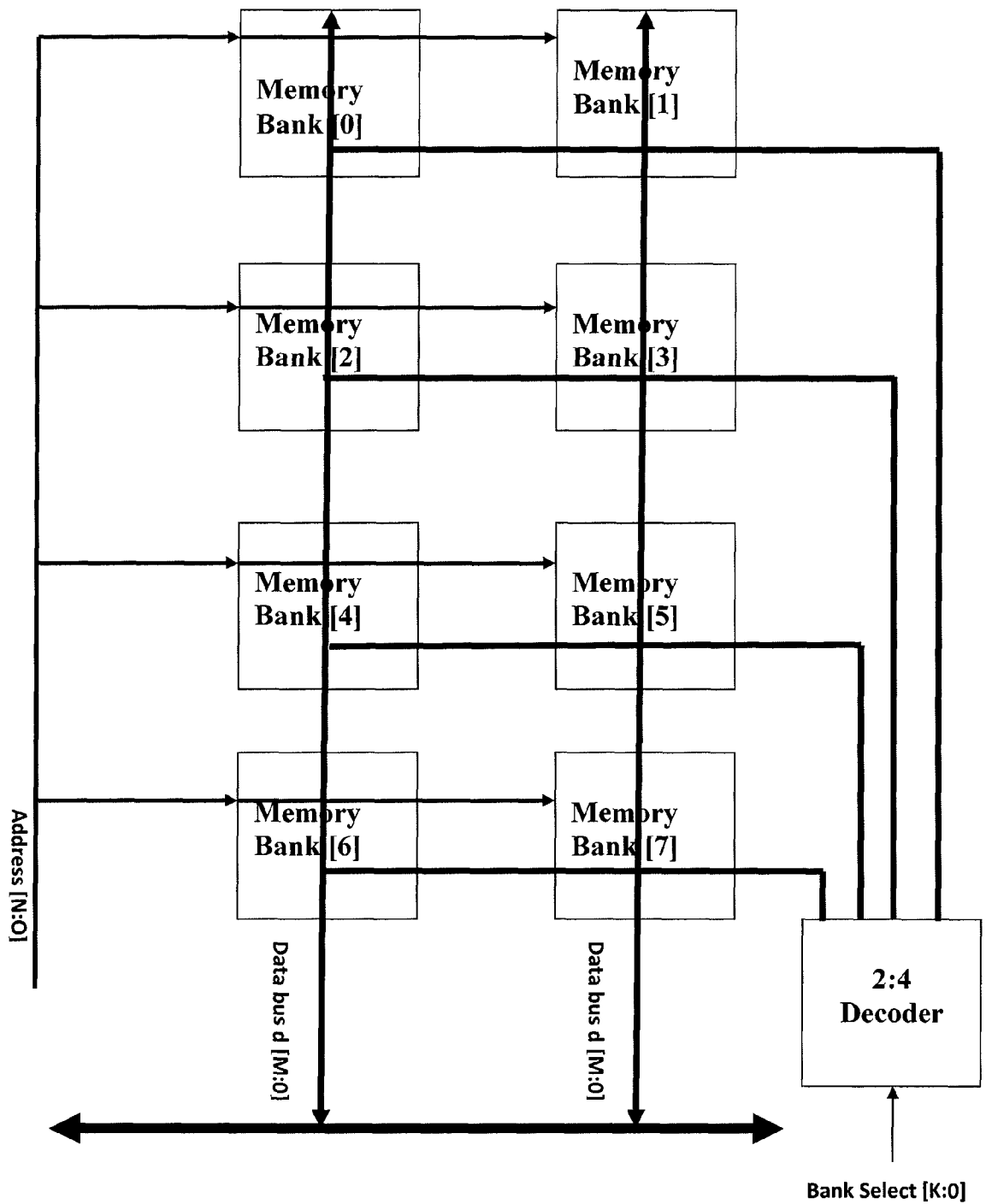
FIG. 5 illustrates a typical memory organization with multiple banks.

As a first aspect of the invention, as illustrated in FIG. 3*b*, there is provided an erasure circuitry 32 for erasing volatile memory cells of the volatile memory. The erasure circuitry 32 includes a negative pulse generator 5. The negative pulse generator 5 includes at least one switch 17 which is connected to Vref of one or more memory cells. Further, the erasure circuitry 32 includes a controller 36 coupled to the at least one switch 17 and a negative power supply 8.

It will be obvious to a person skilled in the art and which is well known in the art that a volatile memory is a set of multiple memory cells. In the present context, a switch is an electrical component generally used for interrupting a current flow in an electric/electronic circuit.

In various embodiments of the present invention, a switch, such as switch 17, may be used for one memory cell at a given moment of time. In one embodiment, a single switch 17 is connected to a block/bank of more than one memory cells together. In another embodiment, multiple switches are installed for various block/bank of more than one memory cells.

In an embodiment of the invention, the switch 17 is controlled by controller 36 of the erasure circuitry 32. In an embodiment, the controller 36 is a DRAM controller.

The controller 36 is associated with the negative pulse generator 5. The controller 36 is also coupled to an erasure module 34, which instructs the controller 36 as to when to activate the negative pulse generator 5 to generate and send the negative pulse.

In one embodiment, the controller 36 instructs the negative pulse generator 5 to generate and send the negative pulse at the occurrence of a predefined event.

The erasure module 34 includes computer instructions adapted to instruct the erasure circuitry 32 regarding the occurrence of a predefined event (explained later). The controller 36 of the erasure circuitry 32 is adapted to receive such instruction from the erasure module 34 and in due course it activates/deactivates the switch 17 which in turn imposes a negative pulse to the Vref of the memory cell. It is known in the art that charge is directly proportional to voltage.

$$Q=CV \quad \text{Formula:}$$

Once the voltage is neutralized, the charge on the capacitor itself reduces to zero logic. When the charge on the capacitor reduces to zero logic at the occurrence of a predefined event, then the data on the volatile memory is erased before that part of the memory is allocated to a different user.

Figure 6:
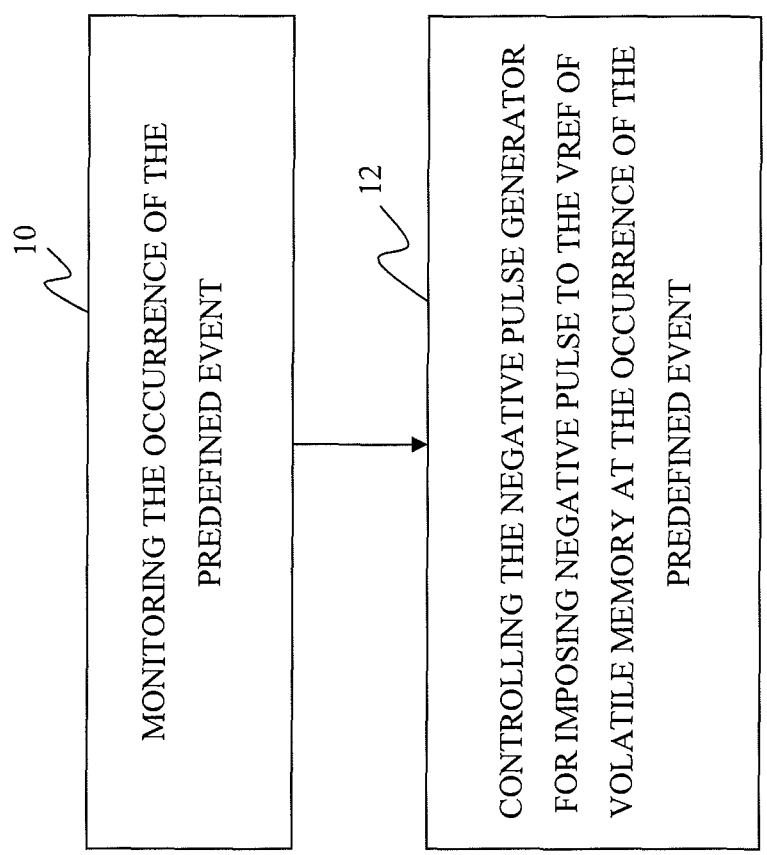
FIG. 6 illustrates a method of erasing a dynamic memory in accordance with an embodiment of the invention.

As illustrated in FIG. 6, there is provided a method of erasing a volatile memory requiring, the erasure method comprising controlling the negative pulse generator 5 for reducing the charge on the capacitor to zero logic at the occurrence of a predefined event.

According to this method, the first step is to monitor the occurrence of the predefined event 10. Once the predefined event occurs, the second step 12 is to control the negative pulse generator 5 for imposing a negative pulse on the Vref of the volatile memory 30 once the predefined event occurs.

The predefined event can be any event pre-configured by a user which when it occurs, data stored on the volatile memory 30 needs to be deleted. When the memory 30 is used by users, processes, applications, and/or services, the predefined event can be for example at the time of use or termination and/or switching between the different users, processes, applications and/or services respectively. For example, when the volatile memory 30 is accessed/shared by multiple users, the predefined event can be after termination of a first user session and/or at the time of switching between one user and another (after session termination of a first user and before session commencement of a subsequent user). This is in order to clean/erase the data stored by a first user on the memory before a second user is granted access to the memory.

Sharing volatile memory 30 between multiple users can happen in various contexts, such as for example in computing clouds where virtual machines accessing a same volatile memory 30 are accessed by multiple users. Computing clouds are not the only environments where memory is shared between users. When the volatile memory 30 is accessed by different processes, applications and/or services (related or not to different users), the predefined event can be at the time of termination of a first process, application and/or service respectively and/or at the time of switching between different processes, applications and/or services.

This can also happen for example in the case of a single machine with multiple user accounts. Once a first user uses the machine, data is normally stored on the volatile memory 30 and is not deleted until the machine is rebooted. Where the machine is not rebooted, a subsequent user accessing the machine can have access to the data stored inside the volatile memory 30. This also poses a risk of privacy breach. The predefined event can be in this case at the termination of the first user session. In this case, data stored on the volatile memory 30 is erased before the commencement of the second user session.

Figure 7:
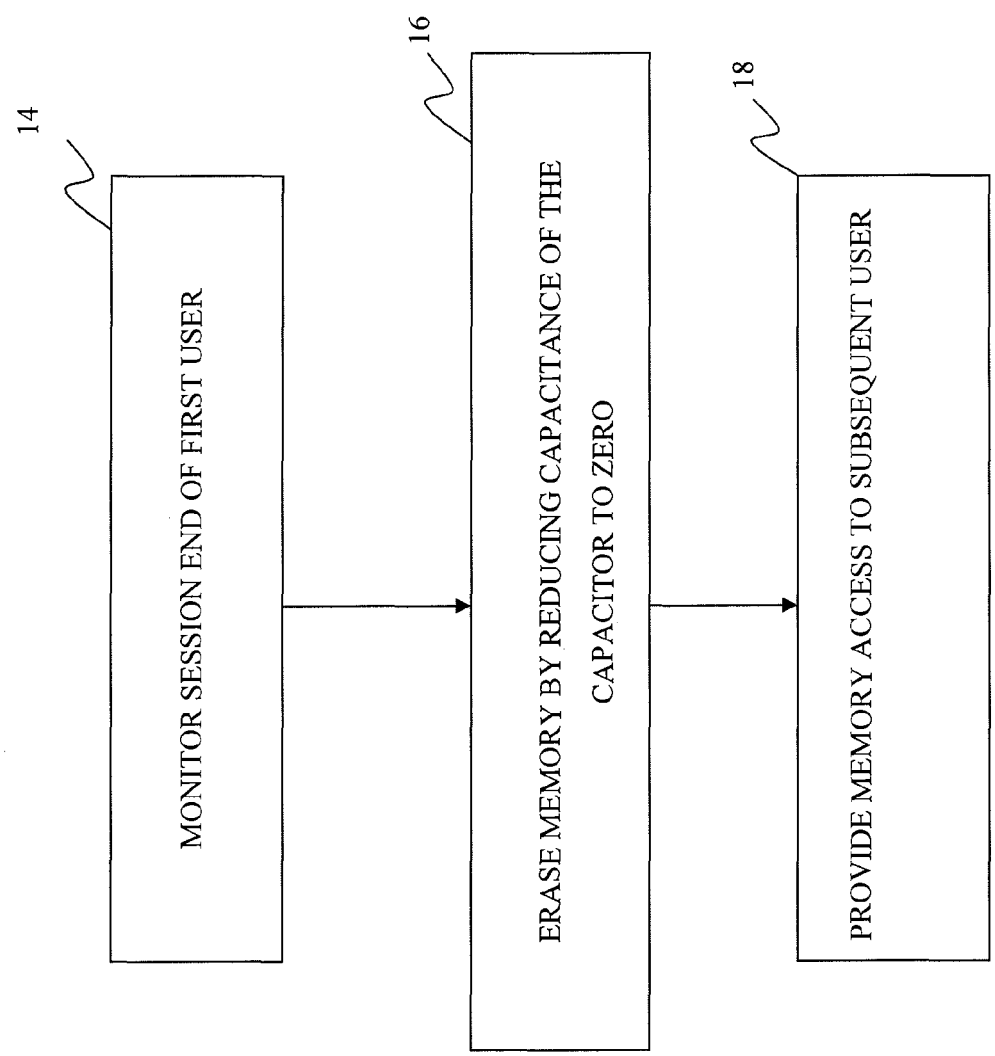
FIG. 7 is a flow chart illustrating an example of application of the method of erasing a dynamic memory in accordance with an embodiment of the invention.

As illustrated in FIG. 7, according to an embodiment of the invention, the first step is to monitor the termination of the first user session at step 14. Once the first user session is terminated, at step 16 the volatile memory is erased by the imposition of negative pulse on the Vref of one or more of the volatile memory cells, by the at least one switch 17. Then, at step 18 the subsequent user is provided access to the memory which is already erased. In this case, there will be no need to reboot the machine to delete the data stored on the memory by the first user or use erasure software which can be time consuming. Erasing the memory using the method of this invention occurs very quickly (in the order of milliseconds).

Figure 8:
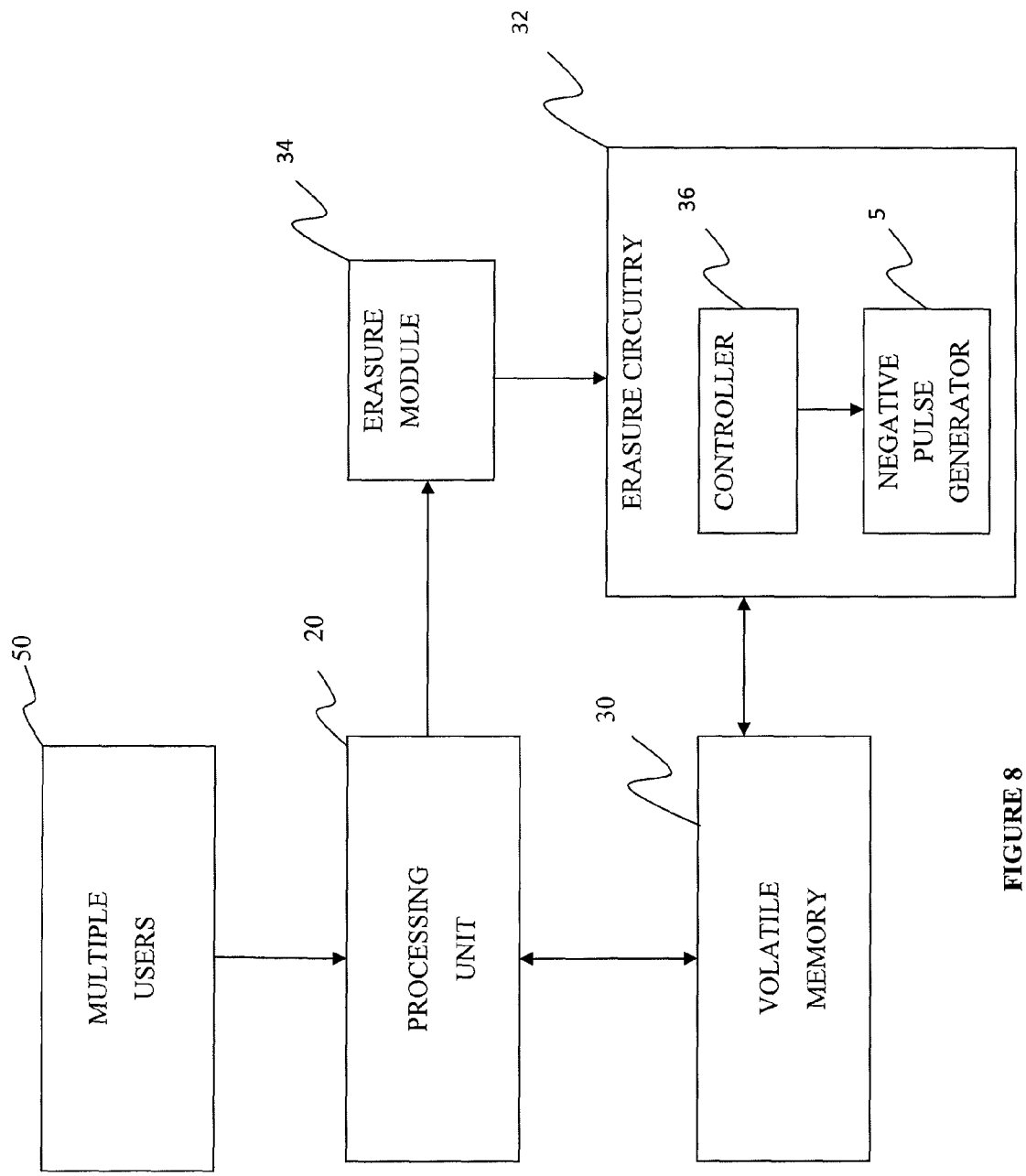
FIG. 8 is a block diagram illustrating multiple user access to a processing unit connected to a volatile memory, erasure module and erasure circuitry in accordance with an embodiment of the invention.

As illustrated in FIG. 8, the volatile memory 30 can for example be connected to a processing unit 20 accessible by multiple users. In this case, the predefined event is before switching between a first user and a subsequent user such that any data stored inside the memory 30 by the first user is erased by the effect of imposition of negative pulse by the switch 17 via a negative power supply 8 on the instructions of the controller 36 of the erasure circuitry 32 before the subsequent user is provided access to the memory 30.

The predefined event is preconfigured using computer readable instructions inside the erasure module 34. The erasure module 34 can run on the same processing unit 20 or on a different processing unit depending on the application. The erasure module 34 is connected to the erasure circuitry 32 which in turn is connected to the volatile memory 30. Once the predefined event occurs, the erasure module 34 provides instructions to the controller 36 of the erasure circuitry 7 which in turn controls the switch 17 in a manner to erase data from inside the volatile memory 20. The erasure module 34 includes computer instructions adapted to instruct the controller 36 of the erasure circuitry 7 regarding the occurrence of the predefined event and the controller 36 in turn controls the negative pulse generator 5 of the erasure circuitry 7 for erasing data from the volatile memory cell.

In an embodiment of the invention, the processing unit 20 is part of a virtual machine in a computing cloud.

In another embodiment of the invention, the processing unit 20 is part of an electronic device or server.

Figure 9:
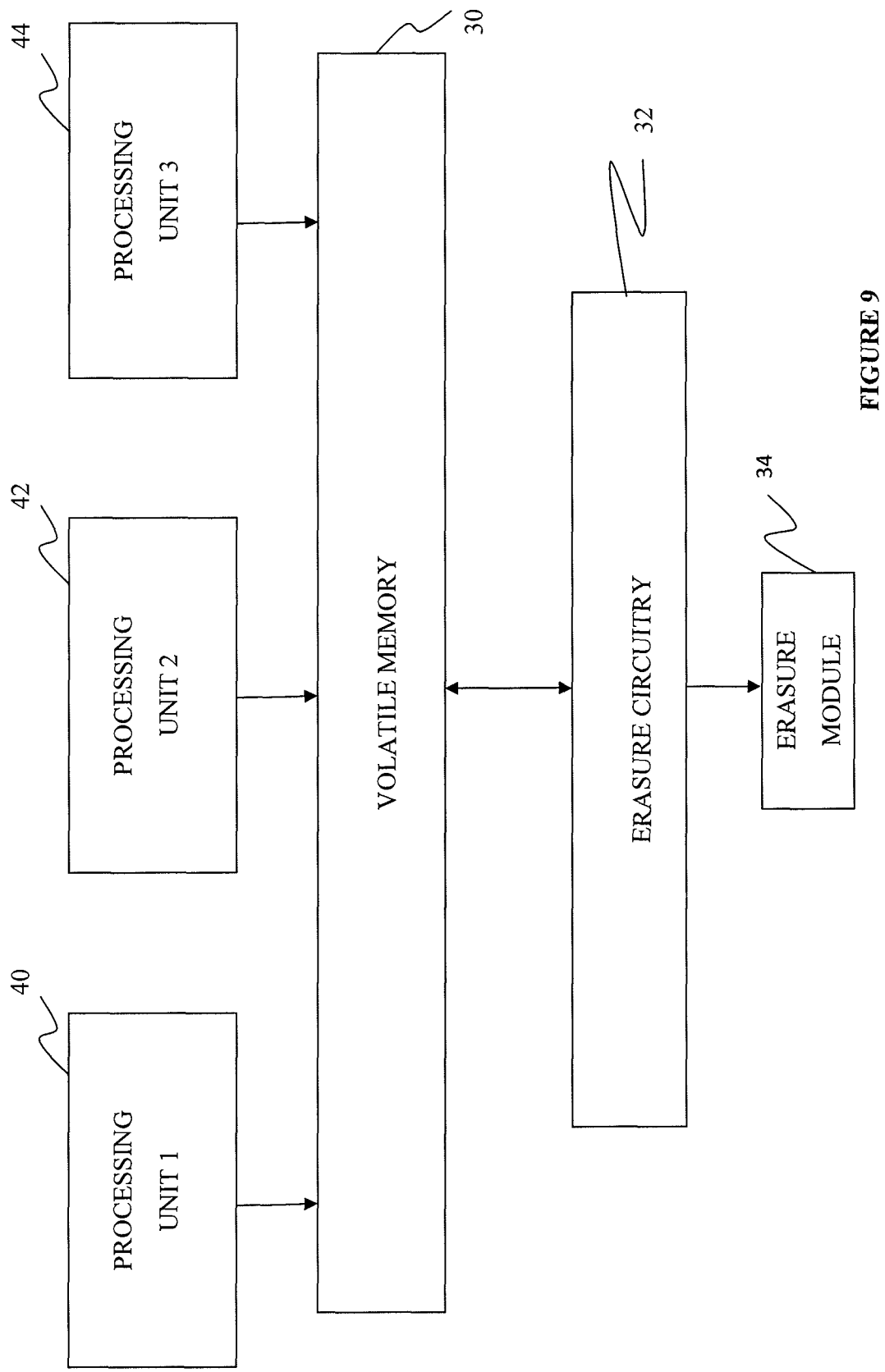
FIG. 9 is a block diagram illustrating multiple processing units connected to a volatile memory, erasure module and erasure circuitry in accordance with an embodiment of the invention.

As illustrated in FIG. 9, the volatile memory 30 can be connected to multiple processing units (40, 42, and 44) for dynamically allocating the volatile memory 30 to the multiple processing units (40, 42, and 44). In this case, the predefined event is before reallocation of the memory 30 from a first processing unit to a second processing unit such that any data stored inside the memory using the first processing unit is erased by the effect of imposition of negative impulse on the Vref by the switch 17 before the second processing unit is being reallocated the memory 30. The predefined event is preconfigured using computer readable instructions inside the erasure module 34. The erasure module 34 can run on any one of the processing units (40, 32, and 44) or on a different processing unit depending on the application. The erasure module 34 is connected to the erasure circuitry 32 which in turn is connected to the volatile memory 30. Once the predefined event occurs, erasure module 34 provides instructions to the controller 36 which in turn controls the switch 17 in a manner to erase data from inside the volatile memory 30. The erasure module 34 includes computer instructions adapted to instruct the controller 36 regarding the occurrence of the predefined event.

In an embodiment of the invention, the processing units (40, 42, and 44) are part of one or more virtual machines in a computing cloud.

Figure 10:
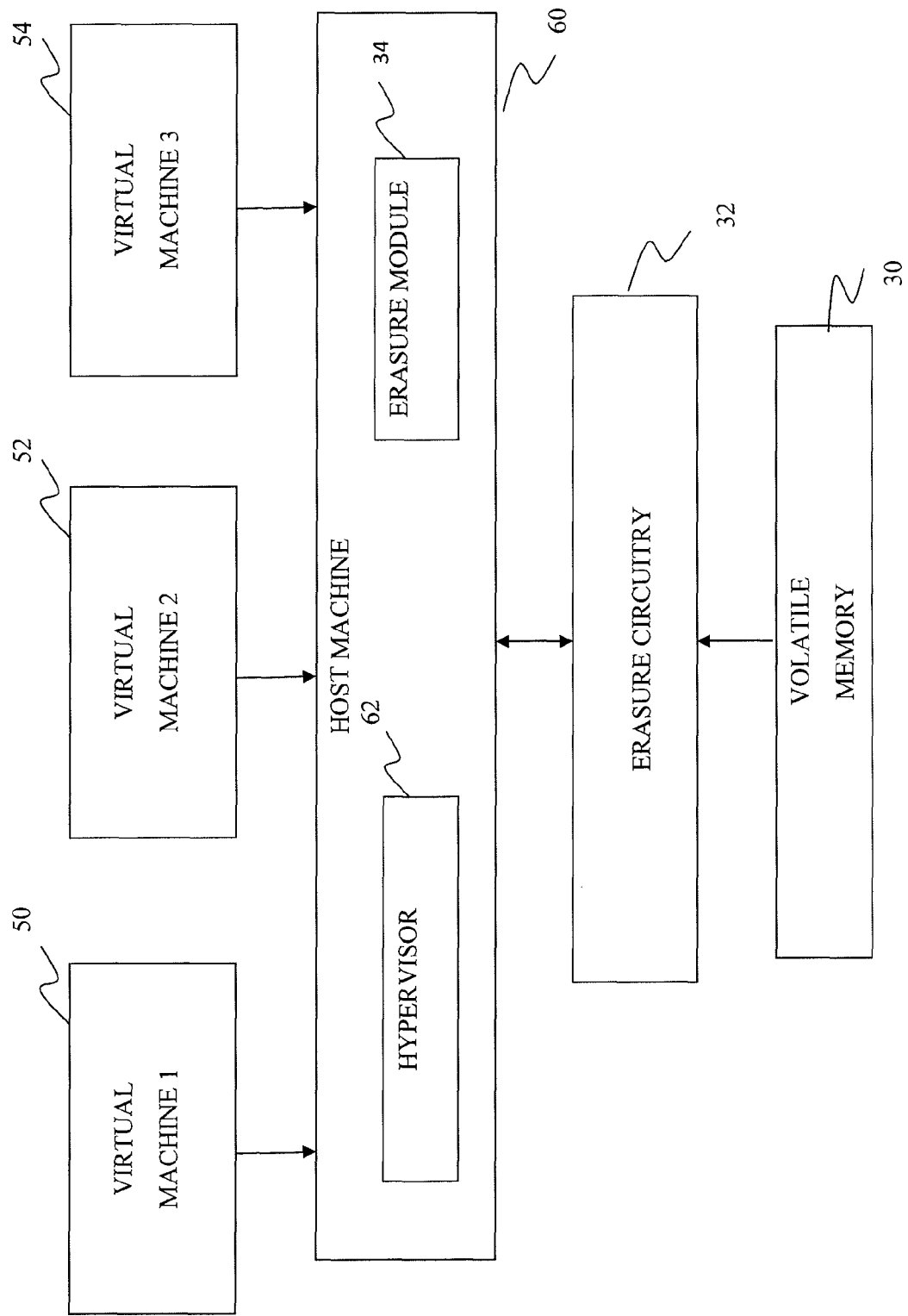
FIG. 10 is a block diagram illustrating multiple virtual machines connected to a host machine, a hypervisor, a erasure module, an erasure circuitry and volatile memory in accordance with an embodiment of the invention.

FIG. 10 illustrates the application of this invention in the context of a computing cloud comprising multiple virtual machines (50, 52, and 54) and a host machine 60 comprising a hypervisor 62. The volatile memory 30 and the erasure circuitry 32 are connected to the host machine (50, 52, and 54) for storing data originating from the use of the virtual machines (50, 52, and 54) by different users. According to this embodiment, the erasure module 34 is adapted to run on the host machine 60 for controlling the method of erasing data from inside the volatile memory 30 at the occurrence of predefined events such as the switching between different users.

In an embodiment of the invention, the volatile memory 30 for erasure is one or more memory banks of a dynamic random access memory (DRAM). The volatile memory 30 can be DRAM or any other type requiring refreshment of data to maintain storage existing now or in the future. When the volatile memory 30 is DRAM, the controller 36 is normally a DRAM controller.

In an embodiment of the invention, as illustrated in FIG. 11, there is provided a computer readable medium 60 encoded with an erasure module 34 comprising processor executable instructions for execution by a processing unit for controlling the controller 36 of the erasure circuitry 32 connected to a volatile memory 30 for imposing the negative pulse on the Vref of the memory cell 30, reducing the charge on capacitor to zero logic.

In an embodiment of the invention, the erasure module 34 includes processor executable instructions for controlling the controller 36. When the volatile memory 30 is in a computing cloud, in an embodiment of the invention, the processor executable instructions are adapted to be run by a hypervisor 62 running one or more virtual machines as described above.

As a further aspect of the invention, as illustrated in FIGS. 12(a) and (b), there is provided an erasure circuitry 32 adapted to be connected to a volatile memory 30, for erasing data of one or more memory cells depending on the occurrence of a predefined event.

In an embodiment of the invention, the event is predefined using processor executable instructions (represented by a erasure module 34), where the erasure circuitry 32 is adapted to receive an electrical signal from a processing unit executing said processor executable instructions 34 for activating/deactivating the switch 17 to reduce the Vref so that the charge on the capacitor of the memory cell reduces to zero logic.

The erasure circuitry 32 can be part of the volatile module 30 (see FIG. 12(a)) or alternatively in an external circuit (see FIG. 12(b)).

As another aspect of the invention, there is provided a volatile memory 30 comprising a an erasure circuitry 32 adapted to impose a negative impulse on the Vref of a volatile memory cell and hence reducing the charge on capacitor to zero logic at the occurrence of a predefined event. The erasure circuitry 32 is adapted to be connected to an erasure module 34 comprising computer instructions for controlling the erasure circuitry 32 at the occurrence of the predefined event for reducing the charge on capacitor to zero logic. In an embodiment of the invention, the volatile memory 30 is a DRAM.

Figure 13:
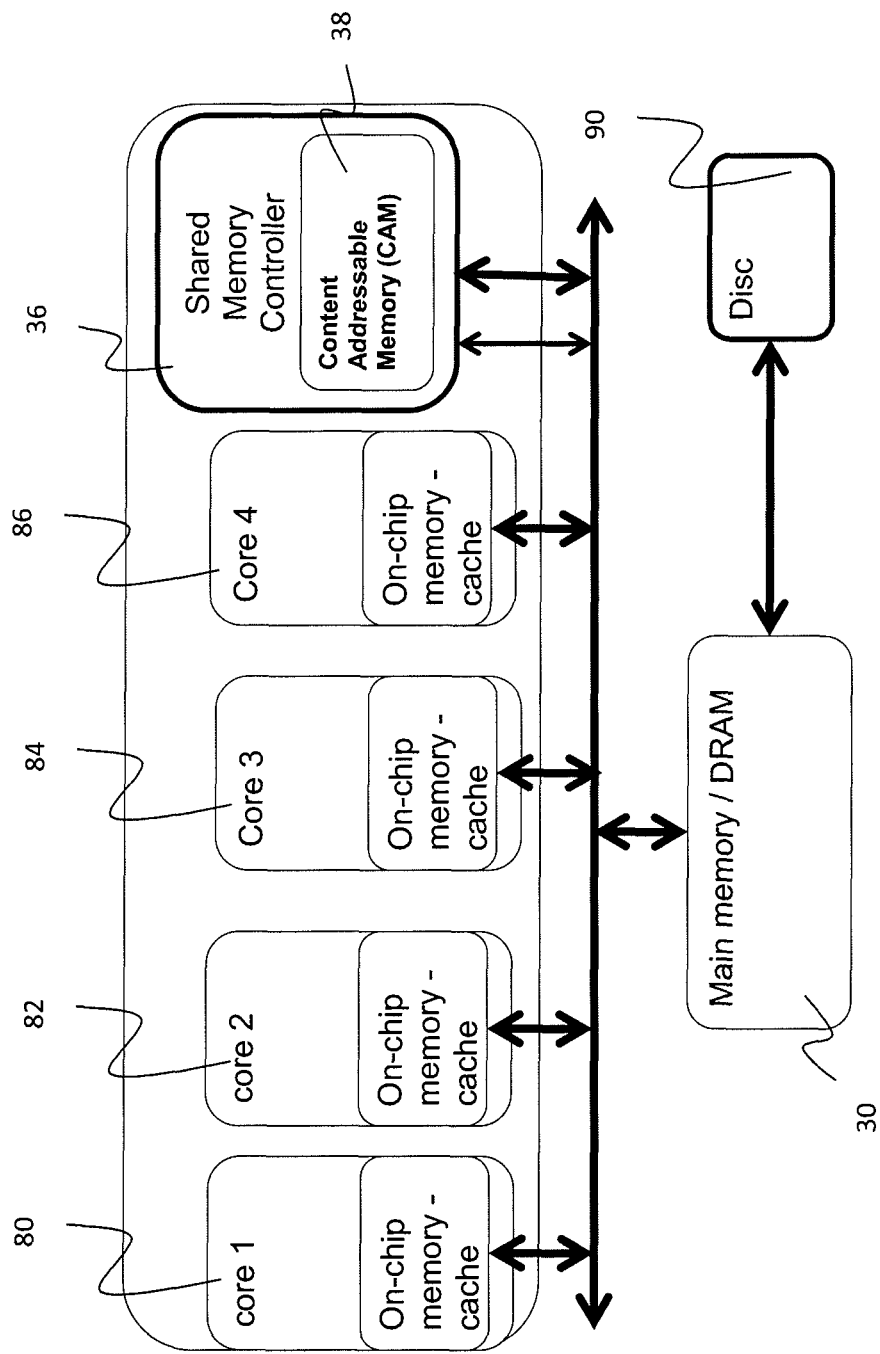
FIG. 13 is a flow chart illustrating a Content Addressable Memory (CAM) operation according to an embodiment of the invention.

As illustrated in FIG. 13, the controller 36 is adapted for the purpose of receiving instructions from the erasure module 34. The controller 36 in accordance with an embodiment of the invention includes a Content Addressable Memory (CAM) 38 adapted to receive addresses of DRAM memory banks from core processes 80, 82, 84, 86 through the erasure module 34. The addresses are stored in a small content addressable memory and factored into the Finite State Machine (FSM) of the controller 36 to make sure that the banks listed in the CAM 38 are not allocated to any new program.

Any refresh, read and/or write operation to the volatile memory 30 will first be directed to the CAM 38 for comparing the addresses of the desired memory banks to be accessed against all addresses indicated inside the CAM 38. If there is no match, then the access is granted. If there is a match, then the access is denied. The CAM 38 content is cleared based on a counter corresponding to the restriction time of the volatile memory 30.

Optionally, the CAM 38 would also contain the size of the memory banks. In an embodiment, the number of memory cells may be one or more than one depending upon the memory required for performing certain activity by a user.

The memory bank addresses sent by the erasure module 34 to the CAM 38 are those which were used before and to be erased, for example those accessed by a previous user, process, application or service and contain data related thereto. The addresses of these banks are communicated by the operating system which has the information. The erasure module 32 can consist of or can be a part of and/or be running at the operating system, hypervisor, device driver or any code that can run on the host or device CPU through which the volatile memory 30 is accessible.

Figure 14:
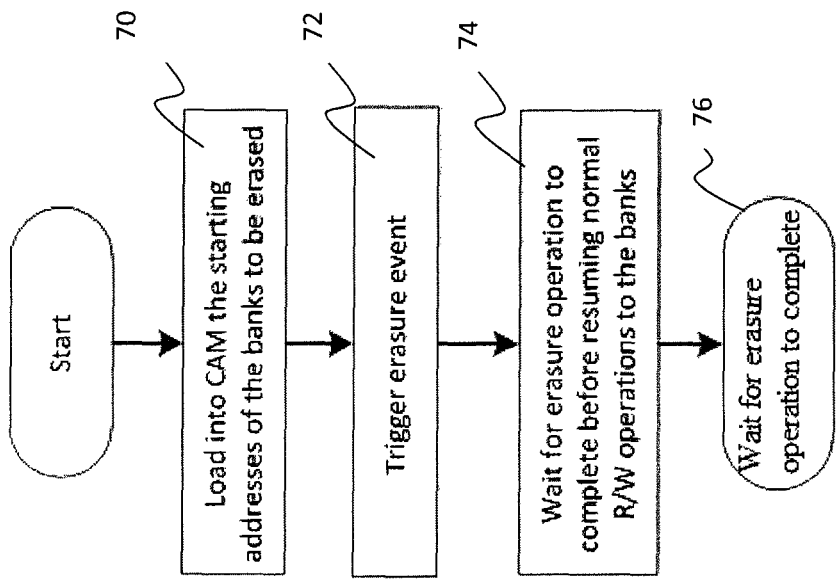
FIG. 14 is a block diagram illustrating a Content Addressable Memory (CAM) in connection with a DRAM Controller in accordance with an embodiment of the invention.

As illustrated in FIG. 14, the erasure module 32 sends the addresses of the banks used by a previous user to the CAM for storage 70. At the occurrence of the predefined event requiring erasure of the data 72, all access requests to the memory 30 are first directed to the CAM 38 which compares the bank addresses to which access is desired to the addresses stored inside the CAM 38 to determine if there is a match. In case there is a match, the access request is denied. In case there is no match, the access request is granted. The access request can be a refresh, write and/or read request. The CAM 38 would restrict any access to these banks the time the data stored inside them are erased by imposing of the negative pulse on the Vref of the memory cell 30, reducing the charge on capacitor to zero logic at step 74. Once the erasure operation is completed, normal read/write operations are resumed as normal at step 76.

The size of the CAM 38 arrays is determined by the erasure time of the DRAM bank and the maximum number of shared programs/users. For example, if in 64 millisecond there can be 1024 users and the number of banks in the DRAM 30 is 1024 banks, then the size of the CAM 38 array is 1024 entry×log 1024 (base 2) which is 10 bits which is in total size of 4 Kilo Byte of CAM bank. This is small compared to the large size of DRAM size of 4 Giga Byte or more for example.

The foregoing descriptions of specific embodiments of the present invention have been presented for purposes of illustration and description. They are not intended to be exhaustive or to limit the present invention to the precise forms disclosed, and obviously many modifications and variations are possible in light of the above teaching. The embodiments were chosen and described in order to best explain the principles of the present invention and its practical application, and to thereby enable others skilled in the art to best utilize the present invention and various embodiments with various modifications as are suited to the particular use contemplated. It is understood that various omissions and substitutions of equivalents are contemplated as circumstances may suggest or render expedient, but such omissions and substitutions are intended to cover the application or implementation without departing from the spirit or scope of the present invention.

The invention claimed is:

1. An erasure circuitry for erasing a dynamic volatile memory comprising a plurality of dynamic memory cells, the erasure circuitry comprising a negative pulse generator adapted to generate a negative pulse for reducing Voltage Reference (Vref) of one or more of the dynamic volatile memory cells to zero logic at occurrence of a predefined event for discharging one or more capacitors related to said one or more of the dynamic volatile memory cells.

2. The erasure circuitry as claimed in claim 1, wherein the negative pulse generator comprises at least one switch, and a negative power source coupled to the at least one switch, for reducing the Vref of the one or more of the dynamic volatile memory cells to zero logic.

3. The erasure circuitry as claimed in claim 2, further comprising a controller associated with the negative pulse generator, and an erasure module associated with the controller, the controller adapted to activate the negative pulse generator on being instructed by the erasure module.

4. The erasure circuitry as claimed in claim 3, wherein the erasure module instructs the activation of the negative pulse generator at the occurrence of a predefined event.

5. The erasure circuitry as claimed in claim 4, wherein the dynamic volatile memory is connected to a processing unit accessible by multiple users, processes, applications or services and wherein the predefined event is before switching between a first user, process, application or service and a subsequent user, process, application or service such that any data stored inside the memory by the first user is erased by the imposition of negative pulse on the Vref by activating the negative pulse generator.

6. The erasure circuitry as claimed in claim 5, wherein the processing unit is part of a virtual machine in a cloud computing platform.

7. The erasure circuitry as claimed in claim 5, wherein the processing unit is part of an electronic device or a server.

8. The erasure circuitry as claimed in claim 5, wherein the dynamic volatile memory is dynamically allocated to multiple processing units and wherein the predefined event is before reallocation of the memory from a first processing unit to a second processing unit such that any data stored inside the memory using the first processing unit is erased by the effect of imposition of negative pulse on the Vref by using the negative pulse generator.

9. The erasure circuitry as claimed in claim 5, wherein the processing units are part of one or more virtual machines in a computing cloud.

10. The erasure circuitry as claimed in claim 1, wherein the dynamic volatile memory for erasure is one or more memory banks of a dynamic random access memory (DRAM).

11. The erasure circuitry as claimed in claim 3, wherein the controller is a DRAM controller.

12. A method of erasing a dynamic volatile memory comprising a plurality of dynamic volatile memory cells, the method comprising imposing a negative pulse on Voltage reference (Vref) of one or more of the dynamic volatile memory cells to reduce the Vref of the one or more of the dynamic volatile memory cells to zero logic at occurrence of a predefined event for discharging one or more capacitors related to said one or more of the dynamic volatile memory cells.

13. The method as claimed in claim 12, wherein the negative pulse is being imposed by using a negative pulse generator comprising at least one switch, and a negative power source coupled to the at least one switch for reducing the Vref to zero logic.

14. The method as claimed in claim 12, wherein the dynamic volatile memory is connected to a processing unit accessible by multiple users, processes, applications or services and wherein the predefined event is before switching between a first user, process, application or service and a subsequent user, process, application or service such that any data stored inside the memory by the first user is erased by the imposition of negative pulse on the Vref by activating the negative pulse generator.

15. The method as claimed in claim 14, wherein the processing unit is part of a virtual machine in a cloud computing platform.

16. The method as claimed in claim 14, wherein the processing unit is part of an electronic device or a server.

17. The method as claimed in claim 12, wherein the dynamic volatile memory is dynamically allocated to multiple processing units and wherein the predefined event is before reallocation of the memory from a first processing unit to a second processing unit such that any data stored inside the memory is erased by the imposition of negative pulse on the Vref by activating the negative pulse generator.

18. The method as claimed in claim 17, wherein the processing units are part of one or more virtual machines in a computing cloud.

19. The method as claimed in claim 12, wherein the dynamic volatile memory for erasure is one or more memory banks of a dynamic random access memory (DRAM).

20. The method as claimed in claim 13 further comprising controlling the negative pulse generator for imposing the negative pulse on Vref via a controller.

21. The method as claimed in claim 20, wherein the controller is a DRAM controller.

22. A dynamic volatile memory comprising a plurality of dynamic volatile memory cells and a negative pulse generator adapted to generate a negative pulse for reducing Voltage reference (Vref) of one or more of the dynamic volatile memory cells to zero logic at occurrence of a predefined event for discharging one or more capacitors related to said one or more of the dynamic volatile memory cells.

23. The dynamic volatile memory as claimed in claim 22, wherein the negative pulse generator comprises at least one switch and a negative power supply, reducing the Vref of the one or more of the dynamic volatile memory cells to zero logic.

24. The dynamic volatile memory as claimed in claim 22, wherein the dynamic volatile memory is a dynamic random access memory (DRAM).

25. The dynamic volatile memory as claimed in 22, wherein the dynamic volatile memory is connected to a processing unit accessible by multiple users, processes, applications or services and wherein the predefined event is before switching between a first user, process, application or service and a subsequent user, process, application or service such that any data stored inside the memory is erased by imposition of negative pulse on the Vref by activating the negative pulse generator.

26. The dynamic volatile memory as claimed in claim 25, wherein the processing unit is part of a virtual machine in a cloud computing platform.

27. The dynamic volatile memory as claimed in claim 25, wherein the processing unit is part of an electronic device or a server.

28. The dynamic volatile memory as claimed in claim 22, wherein the dynamic volatile memory is dynamically allocated to multiple processing units and wherein the predefined event is before reallocation of the memory from a first processing unit to a second processing unit such that any data stored inside the memory using the first processing unit is erased by the of imposition of negative pulse on the Vref by activating the negative pulse generator.

29. The dynamic volatile memory as claimed in claim 28, wherein the processing units are part of one or more virtual machines in a computing cloud.

30. The dynamic volatile memory as claimed in claim 22, wherein the dynamic volatile memory for erasure is one or more memory banks of a dynamic random access memory (DRAM).

31. The dynamic volatile memory as claimed in claim 22 further comprising a controller associated with the negative pulse generator, and an erasure module associated with the controller, the controller adapted to activate the negative pulse generator on being instructed by the erasure module.

32. The dynamic volatile memory as claimed in claim 31, wherein the controller is a DRAM controller.

* * * * *

UNITED STATES PATENT AND TRADEMARK OFFICE
CERTIFICATE OF CORRECTION

PATENT NO. : 9,792,977 B2  
APPLICATION NO. : 14/679162  
DATED : October 17, 2017  
INVENTOR(S) : Mohammad et al.

Page 1 of 1

It is certified that error appears in the above-identified patent and that said Letters Patent is hereby corrected as shown below:

In the Claims

Column 12, Claim 28, Line 16:
"is erased by the of imposition of negative pulse on the Vref"
Should be:
"is erased by the imposition of negative pulse on the Vref"

Signed and Sealed this
Ninth Day of October, 2018

Andrei Iancu
*Director of the United States Patent and Trademark Office*